US011070218B2

(12) United States Patent
Olumuyiwa et al.

(10) Patent No.: US 11,070,218 B2
(45) Date of Patent: Jul. 20, 2021

(54) REAL TIME COUNTER-BASED METHOD FOR THE DETERMINATION AND MEASUREMENT OF FREQUENCY LOCK TIME IN PHASE-LOCKED LOOPS

(71) Applicant: Texas Instruments Incorporated, Dallas, TX (US)

(72) Inventors: Ibukun Oluwagbenga Olumuyiwa, Houston, TX (US); Nirav Narendrakumar Ginwala, Sugar Land, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/851,422

(22) Filed: Apr. 17, 2020

(65) Prior Publication Data

US 2020/0336151 A1    Oct. 22, 2020

Related U.S. Application Data

(60) Provisional application No. 62/835,052, filed on Apr. 17, 2019.

(51) Int. Cl.
| | | |
|---|---|---|
| *H03L 7/06* | (2006.01) | |
| *H03L 7/181* | (2006.01) | |
| *H03L 7/099* | (2006.01) | |
| *G06F 1/08* | (2006.01) | |
| *H03L 7/07* | (2006.01) | |

(52) U.S. Cl.
CPC ............... *H03L 7/181* (2013.01); *G06F 1/08* (2013.01); *H03L 7/07* (2013.01); *H03L 7/0992* (2013.01)

(58) Field of Classification Search
CPC ......... H03L 7/181; H03L 7/0992; H03L 7/07; G06F 1/08
USPC .......................................................... 327/156
See application file for complete search history.

(56) References Cited

U.S. PATENT DOCUMENTS

| | | | | |
|---|---|---|---|---|
| 5,592,632 A | * | 1/1997 | Leung ..................... | G06F 11/10 257/E21.526 |
| 6,466,803 B1 | * | 10/2002 | Gardner ................ | H03J 1/0008 375/355 |
| 7,154,348 B2 | * | 12/2006 | Lee .......................... | H03L 7/085 331/34 |
| 7,511,579 B2 | * | 3/2009 | Wang ...................... | H03L 7/113 327/156 |
| 8,076,979 B2 | * | 12/2011 | Kathuria ................. | H03L 7/095 331/1 R |

(Continued)

*Primary Examiner* — Ryan Jager
(74) *Attorney, Agent, or Firm* — Rose Alyssa Keagy; Charles A. Brill; Frank D. Cimino

(57) ABSTRACT

A system to test a PLL circuit driven by a reference clock includes a first counter coupled to a reference clock output, a first buffer coupled to the first counter, a second counter coupled to a controlled-oscillator (CO) output of the PLL circuit, a second buffer coupled to the second counter, and a processor configured to compute a PLL lock time according to second count values in the second buffer, and to compute a PLL startup slope according to the first count values in the first buffer and the second count values in the second buffer. A method includes powering up a PLL circuit of a wafer, sampling count values of a reference clock and second count values of the PLL circuit and computing a PLL performance parameter according to the sampled count values in a buffer.

18 Claims, 5 Drawing Sheets

(56) References Cited

U.S. PATENT DOCUMENTS

| | | | |
|---|---|---|---|
| 9,252,788 B1 * | 2/2016 | Stanton | H03L 7/0891 |
| 9,385,769 B2 * | 7/2016 | Elzeftawi | H03D 7/1441 |
| 9,813,068 B2 * | 11/2017 | Iwasaki | H03K 4/06 |
| 10,461,756 B2 * | 10/2019 | Tsutsumi | H03L 7/197 |
| 2007/0001770 A1 * | 1/2007 | Wang | H03L 7/113 |
| | | | 331/16 |
| 2011/0057696 A1 * | 3/2011 | Hsieh | H03L 7/099 |
| | | | 327/157 |
| 2013/0249609 A1 * | 9/2013 | Taki | H03L 7/089 |
| | | | 327/156 |

* cited by examiner

| CNT1 | ΔCNT1 | CNT2 | ΔCNT2 | CLK1 CYCLES |
|---|---|---|---|---|
| 1048575 |  | 1048575 |  |  |
| 1048562 | 13 | 1048575 | 0 | 13 |
| 1048549 | 13 | 1048575 | 0 | 26 |
| 1048536 | 13 | 1048575 | 0 | 39 |
| 1048523 | 13 | 1048575 | 0 | 52 |
| 1048510 | 13 | 1048575 | 0 | 65 |
| 1048497 | 13 | 1048575 | 0 | 78 |
| 1048484 | 13 | 1048575 | 0 | 91 |
| 1048471 | 13 | 1048575 | 0 | 104 |
| 1048458 | 13 | 1048575 | 0 | 117 |
| 1048445 | 13 | 1048575 | 0 | 130 |
| 1048432 | 13 | 1048575 | 0 | 143 |
| 1048419 | 13 | 1048575 | 0 | 156 |
| 1048406 | 13 | 1048575 | 0 | 169 |
| 1048393 | 13 | 1048575 | 0 | 182 |
| 1048380 | 13 | 1048575 | 0 | 195 |
| 1048367 | 13 | 1048575 | 0 | 208 |
| 1048354 | 13 | 1048575 | 0 | 221 |
| 1048341 | 13 | 1048568 | 7 | 234 |
| 1048328 | 13 | 1048562 | 6 | 247 |
| 1048315 | 13 | 1048556 | 6 | 260 |
| 1048302 | 13 | 1048540 | 16 | 273 |
| 1048289 | 13 | 1048505 | 35 | 286 |
| 1048276 | 13 | 1048452 | 53 | 299 |
| 1048263 | 13 | 1048384 | 68 | 312 |
| 1048250 | 13 | 1048301 | 83 | 325 |
| 1048237 | 13 | 1048208 | 93 | 338 |
| 1048224 | 13 | 1048106 | 102 | 351 |
| 1048211 | 13 | 1047993 | 113 | 364 |
| 1048198 | 13 | 1047880 | 113 | 377 |
| 1048185 | 13 | 1047770 | 110 | 390 |
| 1048172 | 13 | 1047659 | 111 | 403 |
| 1048159 | 13 | 1047548 | 111 | 416 |
| 1048146 | 13 | 1047438 | 110 | 429 |
| 1048133 | 13 | 1047327 | 111 | 442 |

FIG. 5

REAL TIME COUNTER-BASED METHOD FOR THE DETERMINATION AND MEASUREMENT OF FREQUENCY LOCK TIME IN PHASE-LOCKED LOOPS

REFERENCE TO RELATED APPLICATIONS

Under 35 U.S.C. § 119, this application claims priority to, and the benefit of, U.S. provisional patent application No. 62/835,052, entitled "Real Time Counter-Based Method for the Determination and Measurement of Frequency Lock Time in Phase-Locked Loops", and filed on Apr. 17, 2019, the entirety of which is hereby incorporated by reference.

BACKGROUND

Phase locked loops (PLLs) are analog circuits that provide an output clock signal that is locked to or synchronized with an input clock signal in steady state operation. On startup, however, a controlled oscillator (CO) of the PLL provides a pulse output that ramps up and potentially overshoots before the PLL circuit locks to the input clock signal. The PLL startup ramp rate, and the startup time or lock time of a given PLL circuit can vary according to input frequency and divider configuration, voltage, temperature and process variations. Some integrated circuits (ICs) and other electronic devices include PLL circuits to generate clock signals used for processors or other clocked circuits. Many applications have performance requirements, including maximum startup time specifications, for example, in industrial and automotive systems where a circuit is intended to be operational in a short amount of time after power up. Accordingly, it is important for PLL circuits to lock quickly. During manufacturing, however, PLL performance parameters, such as ramp rate and lock time are difficult and expensive to measure during electronic device manufacturing, where high-cost oscilloscopes and associated test equipment are not feasible for high volume testing or automated production test setups during wafer probe testing.

SUMMARY

One aspect provides a system having a reference clock, first and second counters in a wafer, first and second buffers in a wafer, and a processor. The reference clock has a reference clock output coupled to an input of a PLL circuit in the wafer. The first counter has an input coupled to the reference clock output. The first buffer has an input coupled to an output of the first counter. The second counter has an output and an input coupled to an output of a controlled oscillator (CO) of the PLL circuit. The second buffer has an input coupled to the output of the second counter, and the processor is coupled to the outputs of the first and second buffers.

In one example, the processor is configured to compute a PLL performance parameter according to one or both of first count values in the first buffer or second count values in the second buffer. In one implementation, the processor is configured to compute a PLL circuit lock time according to the first count values in the first buffer and/or the second count values in the second buffer. In one implementation, the processor is also or alternatively configured to compute a slope of the PLL circuit according to the first count values in the first buffer and the second count values in the second buffer.

One example of the system includes a communications terminal coupled to the processor. The communications terminal is adapted to be coupled to a wafer probe test system. The processor is configured to receive a self-test program from the wafer probe test system, and the processor is configured to execute the self-test program to compute the PLL performance parameter or parameters.

In one example, the first buffer is configured to sample and store first count values from the output of the first counter at a sample rate, and the second buffer is configured to sample and store second count values from the output of the second counter at the same sample rate. In one implementation, the processor is configured to control the sample rate.

In one example, the wafer includes multiple die areas, and a first die area includes the first counter, the first buffer, the second counter, the second buffer, and the processor. In one implementation, the first die area includes the reference clock. In one implementation, the first die area includes the PLL circuit.

Another aspect provides a method that includes coupling a reference clock output of a reference clock to an input of a first counter in a wafer, coupling the reference clock output to an input of a phase lock loop (PLL) circuit in the wafer, and coupling an output of a voltage controlled oscillator (CO) of the PLL circuit to an input of a second counter in the wafer. The method also includes powering up the PLL circuit, sampling first count values of the first counter and second count values of the second counter at a sample rate, storing sampled first count values in a first buffer and sampled second count values in a second buffer, and computing a performance parameter of the PLL circuit according to the sampled second count values in the second buffer.

In one example, the method includes using a processor of the wafer to compute the performance parameter of the PLL circuit according to the sampled second count values in the second buffer. One implementation includes engaging a wafer probe test system with a communications terminal of the wafer, loading a self-test program from the wafer probe test system to a memory of the wafer, and executing the self-test program using the processor of the wafer to compute the PLL performance parameter.

In one example, the method includes computing a lock time of the PLL circuit according to the second count values in the second buffer. In one implementation, computing the lock time includes computing a difference value for each sampled second count value in the second buffer as an absolute value of the difference between the sampled second count value and the previous sampled second count value, and determining the number of samples from a time when the PLL circuit was powered up to a time after which subsequent difference values change by one or less.

In one example, the method includes computing a slope of the PLL circuit according to the second count values in the second buffer. In one implementation, computing the slope of the PLL circuit includes computing a difference value for each sampled second count value in the second buffer as an absolute value of the difference between the sampled second count value and the previous sampled second count value. The slope computation in this implementation also includes determining a ramp time value as a number of samples from a ramp start time when the difference value has a last zero value after the PLL circuit was powered up to a ramp peak time when the difference value reaches a peak difference count value, as well as determining a reference clock ramp count value as a difference between the sampled first count value of the ramp start time and sampled first count value of the ramp peak time, and computing the slope of the PLL circuit as the peak difference count value divided by the reference clock ramp count value.

Another aspect provides an electronic device having a semiconductor die, a package structure and leads. The semiconductor die includes a reference clock, a PLL, first and second counters, first and second buffers and a processor. The PLL circuit has a CO and an input coupled to an output of the reference clock. The first counter has an input coupled to the reference clock output, and the first buffer has an input coupled to an output of the first counter. The second counter has an input coupled to an output of the CO, and the second buffer has an input coupled to an output of the second counter. The processor is coupled to the outputs of the first and second buffers. The leads are electrically coupled to the semiconductor die. The package structure encloses a portion of the semiconductor die, and portions of the leads are exposed outside the package structure.

In one example, the first buffer has a control input to control sampling of first count values from the output of the first counter at a sample rate, and the second buffer has a control input to control sampling of second count values from the output of the second counter at the sample rate. In one implementation, the processor has an output coupled to the control inputs of the first and second buffers to control a sample rate of the first and second buffers.

BRIEF DESCRIPTION OF THE DRAWINGS

FIG. 5 is a memory array diagram showing sampled first and second count values, computed difference values and total reference clock cycle values for a wafer probe PLL test.

DETAILED DESCRIPTION

Figure 1:
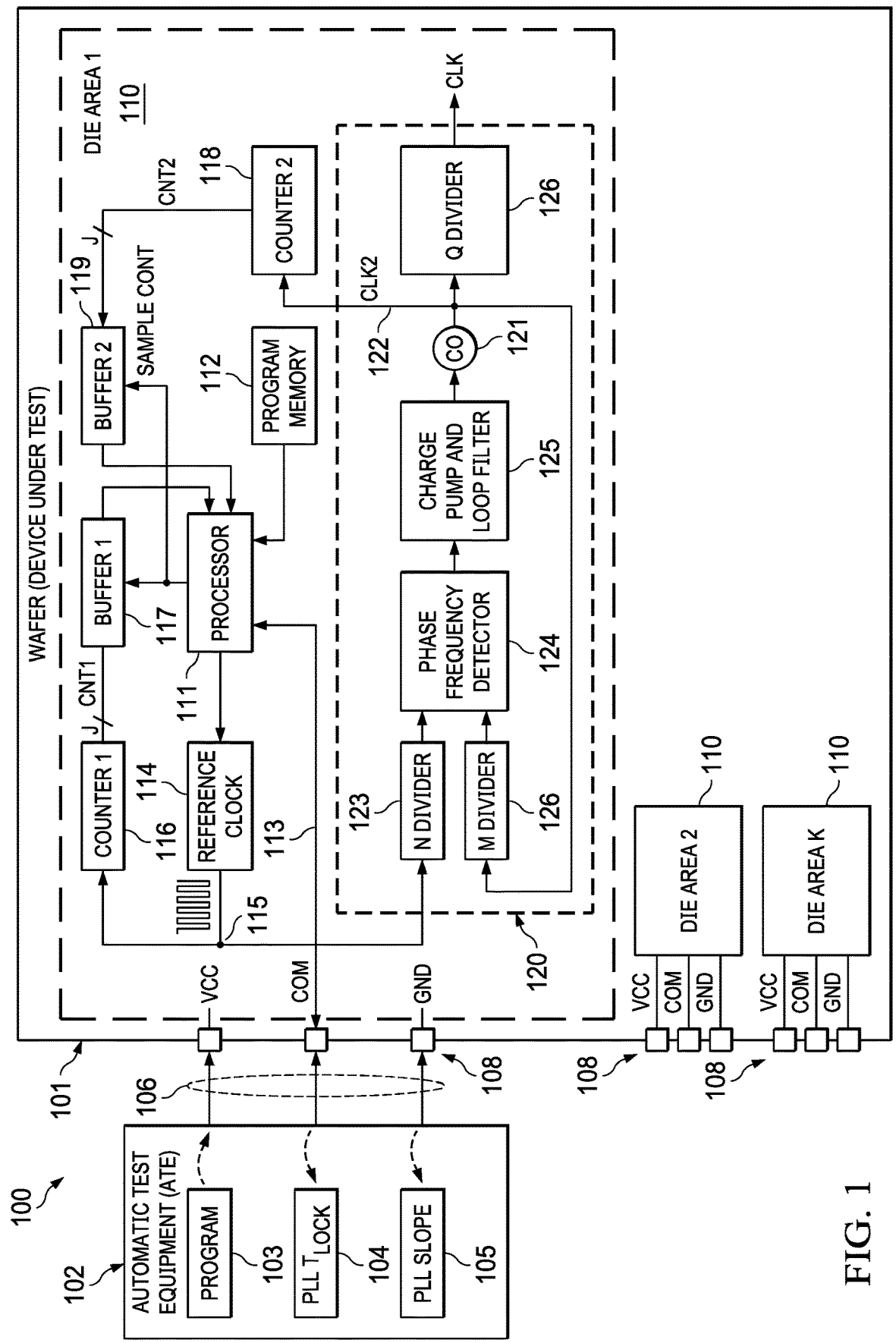
FIG. 1 is a schematic diagram of a wafer test system with wafer probe automatic test equipment and a semiconductor wafer device under test (DUT) with multiple die areas with PLL circuits for testing.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a wafer probe test system 100 in an electronic device manufacturing application for testing circuitry of a previously processed semiconductor wafer 101 as a device under test (DUT) before die singulation and packaging. The system 100 includes automatic test equipment (ATE) 102 with a memory that stores a built-in self-test (BIST) program 103 for downloading and execution in the wafer 101, as well as memory locations to store PLL performance parameters such as a PLL lock time value 104 ($T_{LOCK}$) and a PLL startup slope value 105. The ATE 102 includes conductive probe needles or pins 106 adapted to engage and form electrical connections to die pads or other conductive features 108 of the semiconductor wafer 101. The probe pins 106 and die pads 108 in one example provide communications signal interconnection (e.g., labeled "COM" in FIG. 1), as well as power and ground connections (e.g., respectively labeled "VCC" and "GND").

The wafer 101 includes multiple die areas 110 (e.g., a positive integer number K die areas 110 respectively labeled "DIE AREA 1", "DIE AREA 2", . . . , "DIE AREA K" in FIG. 1). In one example, each die area has die pads 108 electrically coupled to circuitry having a PLL circuit for testing during wafer prober testing in the system 100. In operation, the ATE 102 performs automated wafer probe testing by engaging the probe pins 106 to the die pads 108 of a given die area 110, downloads the BIST program 103 to a processor or memory of the engaged die area 110 for execution by the processor, and receives one or more resulting PLL performance parameter values (e.g., lock time 104, slope 105, etc.) from the die area processor, and then moves to engage the next die area for similar engagement and testing. Following wafer probe testing of the die areas 110, the wafer 101 is singulated to separate individual die areas from one another, and the individual dies (or a subset thereof) are packaged to provide integrated circuits or other forms of packaged electronic devices. The identification of dies having PLL circuits with unacceptable performance parameters allows selective packaging of only dies with acceptable PLL circuitry, thereby saving manufacturing costs and materials.

FIG. 1 shows details of one example die area 110 if the semiconductor wafer 101. The die area 110 includes a processor 111 and a program memory 112 in the wafer 101. The die area 110 also includes a communications terminal 113 coupled to the processor 111. The communications terminal 113 can be coupled to the wafer probe test system ATE 102 via one or more of the die pads 108 and engaged probe pins 106 to allow the processor 111 to receive the BIST program 103 from the wafer probe test system ATE 102, and to store the program instructions into the program memory 112. The processor 111 then executes the self-test program 103 from the die program memory 112 to compute the lock time 104 and the slope 105 of the PLL circuit 120, and the processor 111 sends these test results to the ATE 102.

The die area 110 includes a reference clock 114 with a reference clock output 115, a first counter 116, a first buffer 117, a second counter 118, a second buffer 119 and a PLL circuit 120. The reference clock output 115 is coupled to provide a first clock signal CLK1 to an input of the PLL circuit 120 in the wafer 101, and the reference clock output 115 is coupled to an input of the first counter 116. The first buffer 117 has an input coupled to the output of the first counter 116. The second counter 118 has an input coupled to the PLL circuit 120, and an output coupled to an input of the second buffer 119. The processor 111 is coupled to the output of the first buffer 117 and to the output of the second buffer 119. In one example, the counters 116 and 118 have J-bit binary coded outputs, for example, where J=32 or another integer number greater than 1.

The buffers 117 and 119 have J-bit inputs and control inputs coupled to receive a read or sample control output signal (e.g., labeled "SAMPLE CONT." in FIG. 1) from the processor 111. The processor 111 in this example generates the sample control signal to control a sample rate of the first and second buffers 117 and 119. The first buffer 117 operates according to the sample control signal to sample first count values CNT1 from the output of the first counter 116 at the sample rate, and stores the sampled first count values CNT1 for subsequent operations by the processor 111 to evaluate one or more operating parameters of the PLC circuit 120. Also, the second buffer 119 samples and stores second count values CNT2 from the output of the second counter 118 at the sample rate. In certain examples, the buffers 117 and 119 are separate or combined memory structures with J-bit read inputs to sample the count values CNT1 and CNT2 at the same sample rate under control of the processor 111. The buffers 117 and 119 in one example include additional memory storage capacity to store computed difference values and total cycle values, such as those illustrated and described below in connection with FIG. 5, to facilitate operating parameter computation by the processor 111 according to one or both of the first count values CNT1 in the first buffer 117; and second count values CNT2 in the second buffer 119. In one example, the buffers 117 and 119 are storage areas of a memory (e.g., RAM) of the die area 110, and the processor 111 directly reads the counter outputs and stores the count values CNT1 and CNT2 into the buffer areas of the memory to implement the buffers 117 and 119.

The PLL circuit 120 in FIG. 1 includes a controlled oscillator (CO) 121. In one example, the CO 121 is a voltage-controlled oscillator (VCO). In another example, the CO 121 is a current-controlled oscillator (CCO or ICO). In another example, the CO 121 is a digital-controlled oscillator (DCO). The CO 121 has an output 122 that is coupled to provide a second clock signal CLK2 to the input of the second counter 118. The PLL 120 also includes a first divider 123, a phase frequency detector 124, a charge pump and loop filter circuit 125, a second divider 126 that provides a PLL clock output signal CLK, and a feedback divider 126. The first divider 123 has an input coupled to receive the first clock signal CLK1 from the output 115 of the reference clock 114.

The first divider 123 divides the clock signal CLK1 by an integer N that is greater than or equal to 1 and provides a divided output clock signal to a first input of the phase frequency detector 124. A second input of the phase frequency detector 124 is coupled to receive a divider clock signal from the feedback divider 126. The feedback divider divides the second clock signal CLK2 from the output 122 of the CO 121 by an integer M that is greater than or equal to 1. The phase frequency detector 124 generates an output signal based on the difference between the signals from the dividers 123 and 126 to the input of the charge pump and loop filter circuit 125. The charge pump and loop filter circuit 125 generates an analog output voltage signal as an input to the CO 121 to control the frequency of the CO output clock signal CLK2. The closed loop feedback operation of the PLL circuit regulates the frequency of the PLL clock output signal CLK to reduce the phase and/or frequency difference between the first divider output signal from the divider 123 and the feedback signal from the feedback divider 126.

The counters 116 and 118 in one example are configured to count down in response to a predefined edge (e.g., rising or falling) edge or transition of the input signal received from the respective sources 114 and 121, although not a requirement of all possible implementations. In other examples, up-counters are used, or combinations of up and down-counters responsive to clock signal inputs.

The wafer probe testing can be used to identify whether the PLL circuit 120 of the individual die areas 110 has acceptable performance parameters, such as lock time 104 ($T_{LOCK}$) and/or slope 105. The illustrated example uses the counters 116 and 118 along with the buffers 117 and 119 to digitally characterize both the lock time response and startup slope of the tested PLL circuit 120, and the die processor 111 to computes these performance parameters according to one or both of the first count values CNT1 in the first buffer 117, and second count values CNT2 in the second buffer 119. In other implementations, the system 100 automatically determines either one of these performance parameters 104 or 105, or a different performance parameter of the tested PLL circuit 120.

The illustrated example, moreover, uses an on-die reference clock 114, on-die counters 116, 118 and on-die buffers 117, 119 for the PLL testing. This implementation advantageously repurposes these circuits already present in the die design for PLL testing during automated wafer probe testing in the system 100 without adding the cost and complexity of oscilloscopes and associated circuits to the wafer probe testing apparatus, and thus achieves intelligent design-for-test objectives. For example, the die areas 110 can be industrial or automotive digital and mixed-signal microcontrollers with on-board processors as well as the counters 116, 118 and buffers 117, 119, where these circuit components are designed and used for frequency measurement in the finished packaged electronic device. The described system 100 and built-in self-test techniques repurpose the counters 116 and 118 for real time digitization of the PLL frequency response. In certain examples, moreover, the BIST program 103 is executed by the die processor 111 to process the counter data in the buffers 117 and/or 119 to compute precise lock time and slope measurements with the maximum cycle accuracy possible given the reference clock speed and memory buffer size.

In other implementations, the reference clock 114 is in the wafer 101 outside the die area 110 of the PLL circuit 120 being tested, and the wafer 101 includes multiplexers or other switching circuitry (not shown) to selectively couple the reference clock output 115 to the first counter input and to the PLL input during testing of a given die area 110. In another implementation, the ATE 102 includes the reference clock 114, and the reference clock output 115 is coupled to the first counter input and to the PLL input during testing of a given die area 110 by corresponding connection through one or more probe pins 106 and wafer die pads 108.

In certain implementations, one or both of the counters 116, 118 are in the wafer 101 outside the die area 110 of the PLL circuit 120 being tested, and the wafer 101 includes multiplexers or other switching circuitry (not shown) to selectively couple the counters 116 and 118 to respective outputs of the reference clock 114 and the CO 121 during testing of a given die area 110.

In certain implementations, one or both of the buffers 117 and/or 119 are in the wafer 101 outside the die area 110 of the PLL circuit 120 being tested, and the wafer 101 includes multiplexers or other switching circuitry (not shown) to selectively couple the outputs of the counters 116 and 118 to the respective buffers 117 and 119, and to couple the buffer outputs to the processor 111.

The system 100 facilitates automated testing of PLL circuits at wafer prober testing to ensure acceptable startup or lock time and startup ramp rate performance, for example, in the manufacture of digital and mixed-signal microcontrollers for automotive and industrial applications. Microcontrollers can use a fixed counter to identify a locked PLL state in field use, but no reliable and economical built-in method has been found to detect the point in time at which the PLL frequency stabilization happens in a production setting. Measuring start-up time using high precision oscilloscopes is not feasible for large scale production testing, as this approach cannot be automated without high-end scope equipment, which is not portable to allow use in a production test environment.

The disclosed system 100 automatically samples the PLC frequency signal at a sufficient rate to characterize PLL frequency response curve, using counters and buffers available in the wafer 101, and BIST program instructions 103 to allow reliable, high speed PLL performance testing across all frequency conditions. No external ATE resources are needed in certain examples, and wafers having existing counters and buffers can be easily designed for testing to provide PLL test results that are highly correlated with actual scope measurements. The BIST counter approach enables multi-site testing for each production wafer 101 (e.g., 96, 128 or more touch down probe sites per wafer), along with low cost or test (COT) adder while significantly improving quality coverage. Moreover, the example system 100 and test techniques enable large sample testing across process, voltage and temperature (PVT) for comprehensive validation and characterization.

Figure 2:
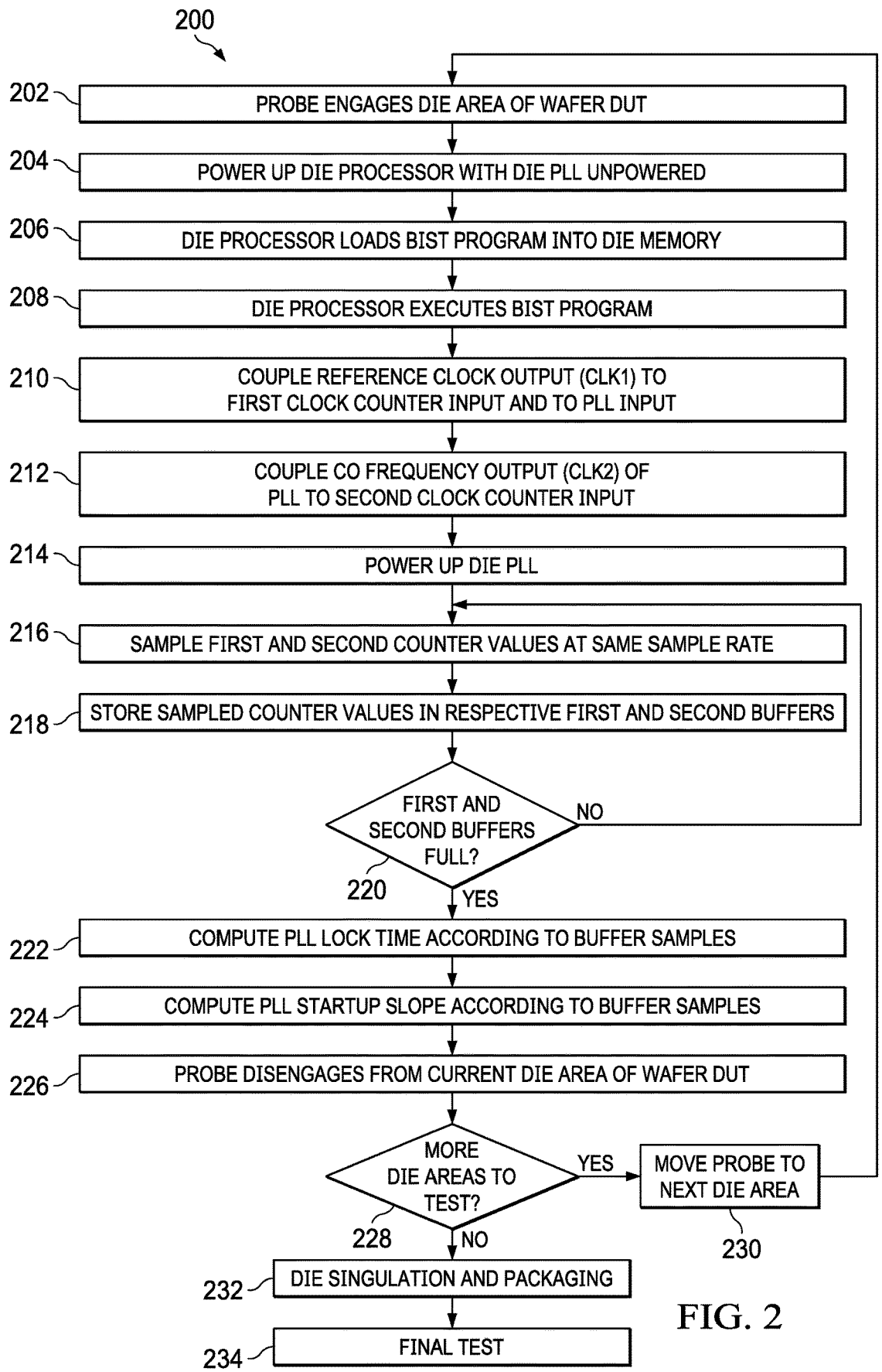
FIG. 2 is a flow diagram of a wafer probe test method.

FIG. 2 shows a wafer probe test method or process 200, which is described hereinafter in the context of the system 100 and the wafer 101 of FIG. 1. The method 200 illustrates wafer probe testing of multiple die areas 110 of the wafer 101. At 202, the wafer probe (e.g., the ATE probe pins 106 in FIG. 1) engages the wafer probe test system ATE 102 with the communications terminal 113 in a first die area 110 (labeled "DIE AREA 1") of the wafer 101. At 204, the ATE 102 powers the die processor 111 up with the PLL 120 unpowered. At 206, the ATE die processor 111 loads the self-test (e.g., BIST) program 103 from the wafer probe test system ATE 102 to the program memory 112 of the wafer 101. At 208, the die processor 111 executes the self-test program 103 to operate the PLL according to the first clock signal CLK1 of the reference clock 114 and to compute one or more performance parameters (e.g., lock time 104, slope 105, etc.) of the PLL circuit 120.

In one example, the die processor 111 controls one or more multiplexers or other switching circuits (not shown) at 210 and 212 to interconnect the tested PLL circuit 120 with the reference clock 114, the counters 116, 118, and the buffers 117, 119. In other implementations, for example, where these components are already interconnected on the die area 110 of the wafer 101, these steps are omitted. At 210, the method 200 includes coupling the reference clock output 115 to the input of the first counter 116, and also to the input of the PLL circuit 120. At 212, the example method 200 includes coupling the CO output 122 of the PLL circuit 120 to the input of the second counter 118 in the wafer 101.

At 214, the processor 111 controls power up of the die PLL circuit 120. Thereafter, the processor 111 in one example controls sampling of the first and second counter outputs by the respective buffers 117 and 119 at a single constant sample rate, although not a strict requirement of all possible implementations.

The method 200 continues at 216 with sampling 216 the first count values CNT1 of the first counter 116 and the second count values CNT2 of the second counter 118 at a sample rate. In the illustrated example, the processor 111 of the probed die area 110 controls the sample rate by generating the sample control signal SAMPLE CONT. with suitable rising or falling edges to cause the respective buffers 117 and 119 to sample (e.g., store) the respective first and second count values CNT1 and CNT2 at the outputs of the first and second counters 116 and 118. The first buffer 117 operates according to the sample control signal to sample first count values CNT1 from the output of the first counter 116, and the second buffer 119 operates according to the same sample control signal to sample second count values CNT2 from the output of the second counter 118. At 218, the sampled first count values CNT1 are stored in the first buffer 117 and the sampled second count values CNT2 are stored in the second buffer 119.

The method 200 continues at 220. In one implementation, the processor 111 is configured by the BIST program 103 to implement a predetermined number of sample cycles, for example, to fill the buffers 117 and 119, or to otherwise sample and store a sufficient number of samples representing an amount of time that exceeds an acceptable PLL startup or lock time for a given application. In this manner, the processor 111 can later determine whether the tested PLL circuit 120 of the engaged die location 110 locks within the acceptance specification based entirely on the count values stored in one or both of the buffers 117 and 119. In the example of FIG. 2, the processor determines at 220 whether the buffers 117 and 119 are full. If not (NO at 220), the sampling and storing of sampled count values repeats at 216 and 218. When the desired number of sampled first and second count values CNT1 and CNT2 have been stored (YES at 220), the processor 111, the processor 111 computes one or more performance parameters (e.g., 104, 105) of the PLL circuit 120 at least partially according to the sampled second count values CNT2 in the second buffer 119.

In one example, the processor 111 computes the lock time 104 of the PLL circuit 120 at 222 according to the second count values CNT2 in the second buffer 119 and the processor 111 transmits the computed lock time 104 to the ATE 102. In the illustrated example, the processor 111 also computes the PLL slope 105 at 224 at least partially according to the second count values CNT2 in the second buffer 119 and transmits the computed slope 105 to the ATE 102. In another implementation, the processor 111 computes the slope at 224 and the lock time computation at 222 is omitted. In other implementations, the processor 111 computes a different PLL performance parameter according to sampled count values stored in one or both of the buffers 117 and 119, whether alone or in combination with one or both of the lock time and slope computations at 222 and/or 224 of FIG. 2.

In one example, the ATE 102 compares the stored lock time 104 at 222 with an associated threshold value (not shown) to determine whether or not the tested PLL circuit 120 is acceptable for a given product design, and updates a flag associated with the engaged die area 110 accordingly. In the illustrated example, the ATE 102 also compares the stored PLL slope 105 at 224 with a corresponding threshold value (not shown) to determine whether or not the tested PLL circuit 120 is acceptable, and updates a flag associated with the engaged die area 110 accordingly. For example, the die area 110 is identified as unacceptable if either of the performance parameters 104 and/or 105 is outside an acceptable range based on the threshold comparisons.

In another implementation, the die processor 111 performs the threshold comparison or comparisons and sends a flag to the ATE 102 indicating whether the PLL passed or failed the performance testing. The system 100 uses the pass or fail designation to determine whether to use each given die area 110 for producing a packaged electronic device in subsequent packaging and final test operations after die separation (e.g., singulation).

At 226, the probe pins 106 of the ATE 102 are disengaged from the current wafer die area 110, and the ATE 102 determines at 228 whether more die areas 110 remain untested. If so (YES at 228), the wafer probe equipment is translated or otherwise moved to the next die area 110 at 230, and the test method 200 returns to engage the next die area for testing at 202 as previously described. If all scheduled die areas 110 have undergone PLL testing (NO at 228), the wafer 101 undergoes die singulation and packaging at 232 to produce a packaged electronic device, such as an integrated circuit product (e.g., FIG. 6 below), and the packaged electronic device undergoes final testing at 234.

Figure 3:
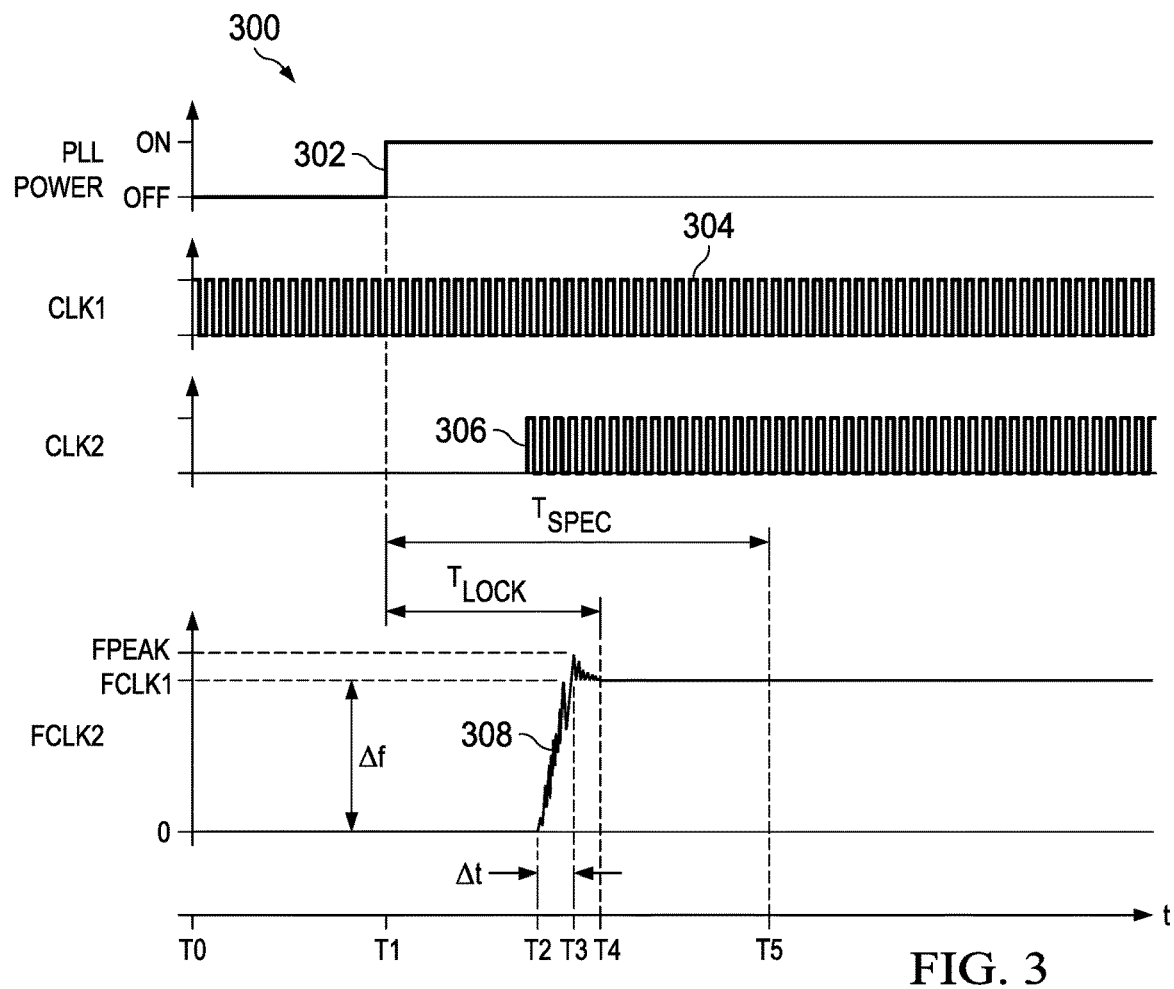
FIG. 3 is a signal diagram with power clock and CO output frequency curves in a die area of the wafer of FIG. 1 during wafer probe testing.
Figure 4:
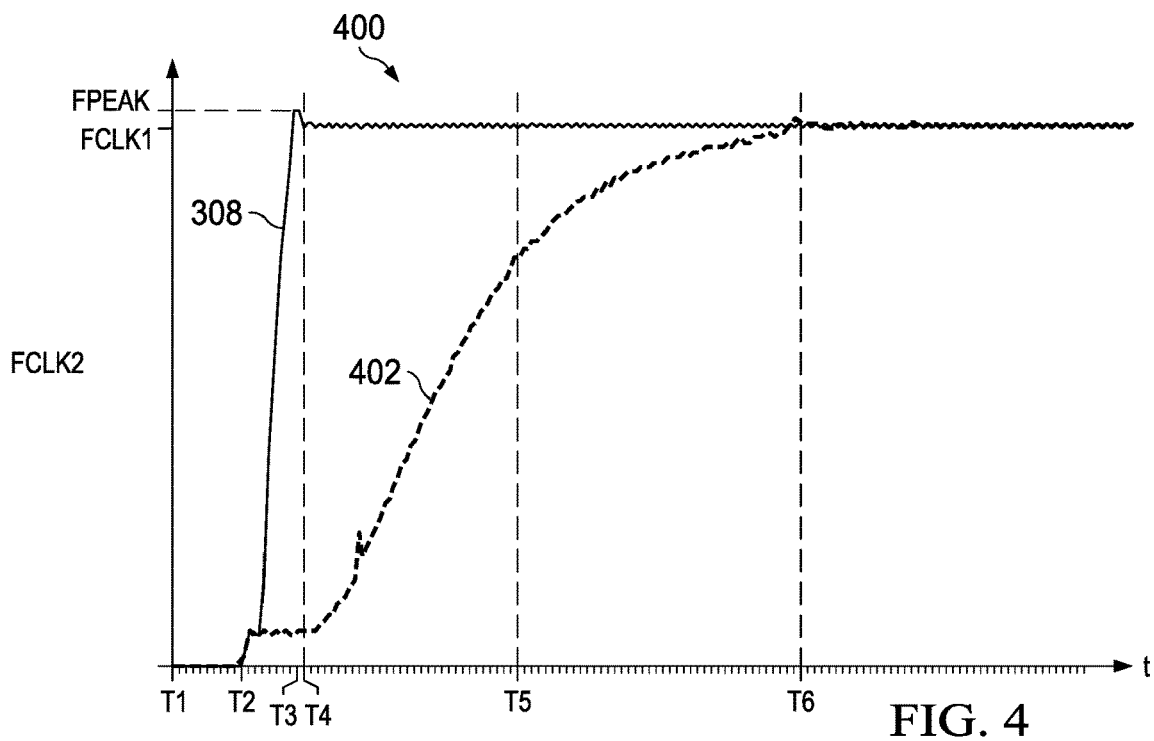
FIG. 4 is a graph of CO output frequency during wafer probe testing for a first PLL circuit with an acceptable lock time and a second PLL circuit with an unacceptable extended lock time.

Referring also to FIGS. 3-5, FIG. 3 shows a signal diagram 300 that includes a power curve 302 (labeled "PLL POWER"), a first clock curve 304 that shows the first clock signal CLK1 of the reference clock output 115, and a second clock curve 306 that shows the second clock signal CLK2 of the CO output 122. The graph 300 also includes a CO output frequency curve 308 that shows the frequency FCLK2 of the second clock signal CLK2 of the CO output 122 in a die area of the wafer 101 during wafer probe testing according to the method 200. FIG. 4 includes a graph 400 of CO output frequency (FCLK2) as a function of time during wafer probe testing. The graph 400 shows the CO output frequency curve 308 for a first PLL circuit 120 with an acceptable lock time $T_{LOCK}$, and comparative CO output frequency curve 402 for a second PLL circuit 120 with an unacceptable extended lock time. FIG. 5 shows a memory array diagram 500 that includes example sampled first and second count values CNT1 and CNT2, computed difference values ΔCNT1 and ΔCNT2 and total reference clock cycle values CLK1 CYCLES for a wafer probe PLL test.

As best seen in FIG. 3, the ATE 102 powers the die processor 111 on at time T0 while the power to the PLL circuit 120 (curve 302) remains off. The reference clock 114 provides the first clock signal CLK1 and the reference clock output 115 beginning at T0 with the initial application of power to the tested die area 110. In another example, the reference clock 114 can be powered separately, for example, after T0. With the first clock signal CLK1 established, the processor 111 powers the PLL circuit 120 up at time T1. The CO 121 begins providing the second clock signal CLK2 (curve 306) at time T2. The frequency FCLK2 (curve 308) of the second clock signal begins to rise at T2 and reaches a peak value (labeled "FPEAK" in FIG. 3) at time T3. Thereafter, the frequency FCLK2 decreases to a steady state value FCLK1 at time T4, where the steady state value FCLK1 corresponds to the frequency of the first clock signal CLK1 at the reference clock output 115.

In this example, the end use application specification for the maximum lock time $T_{LOCK}$ corresponds to time T5 shown in FIGS. 3 and 4. The lock time is measured beginning at time T1 when the PLL circuit 120 is power on or otherwise enabled, and the maximum allowable lock time per the specification $T_{SPEC}$=T5-T1. The first example PLL test (curve 308 in FIGS. 3 and 4) locks at the steady state value FCLK1 at time T4 well before the specified limit T5. The CO frequency of the second tested PLL circuit 120 shown in curve 402 of FIG. 4, however, does not lock at the final value FCLK1 until a time T6 significantly longer than the specification limit T5. In this example, the system 100 differentiates between the die areas of the two example tested PLL circuits 120, identifies the first PLL (corresponding to curve 308) as passing the test, and identifies the other PLL circuit 120 (curve 402) as failing the performance test.

FIGS. 3 and 5 illustrate on example implementation of the computations for the PLL lock time $T_{LOCK}$ and the PLL startup slope. The memory array diagram 500 in FIG. 5 shows example sampled first count values CNT1, sampled second count values CNT2, computed difference values ΔCNT1 and ΔCNT2 and total reference clock cycle values CLK1 CYCLES for a wafer probe PLL test. The memory array diagram 500 also shows corresponding times T1-T4 from FIGS. 3 and 4 for reference.

In this example, the processor 111 computes the lock time 104 of the PLL circuit 120 according to the second count values CNT2 in the second buffer 119 (e.g., at 222 in FIG. 2). In one implementation, for each sample of the second counter 118, the processor 111 computes the difference value ΔCNT2 as an absolute value of a difference between the sampled second count value CNT2 and the previous sampled second count value CNT2. The processor 111 in this example also computes the other difference value ΔCNT1 for each sample as an absolute value of a difference between the sampled first count value CNT1 and the previous sampled first count value CNT1, although not required in all implementations. The example memory array diagram 500 also includes a final column that shows a total number of cycles of the first clock beginning when the PLL is power up at T1 (labeled CLK1 CYCLES), although not a strict requirement of all possible implementations. The processor determines the number of samples that correspond to the PLL lock time $T_{LOCK}$ by determining a number of samples from the time T1 when the PLL circuit 120 was powered up at 214 to a time T4 after which subsequent difference values ΔCNT2 change by one or less. In the illustrated example, the processor 111 initially sets both counters 116 and 118 to a known maximum value (e.g., 1048575) before starting the reference clock 114 at T0 of FIG. 3.

The processor 111 thereafter powers the PLL circuit 120 up at T1, and initiates sampling of the counter outputs by the buffers 117 and 119 at the sample rate, whether directly or through processor reads of the counter outputs and storage of the sample count values into RAM. In this example, the counters 116 and 118 count down from the initial value as shown in the memory array diagram 500 of FIG. 5. In one implementation, the processor 111 controls the sampling and storage for a fixed number 2048 samples, although not a strict requirement of all possible implementations. In the illustrated example, moreover, the sample rate provides a sample window that corresponds to 13 cycles of the first clock signal CLK1 from the reference clock 114, and the resolution of the lock time computation is +/−13 reference clock cycles, although not a strict requirement of all possible implementations.

To determine the lock time $T_{LOCK}$, the processor 111 performs a backward search (e.g., from the bottom upward in FIG. 5) on the difference values ΔCNT2 to identify the time T4 after which subsequent difference values ΔCNT2 change by one or less. The search in the illustrated example identifies a steady state sample with a value (e.g., 110, labeled CNT-SS in FIG. 5) after which subsequent difference values ΔCNT2 change by one or less. In this example, the processor 111 identifies the lock time count value (CNT-LOCK in FIG. 5) as the number of reference clock cycles (e.g., 390) from the fifth column at time T4. The processor 111 computes the lock time $T_{LOCK}$ as the product of this number of reference clock cycles CNT-LOCK times the period of the reference clock output signal CLK1, which the processor 111 transmits to the ATE 102 as the lock time value 104. In another example, the processor 111 transmits the lock time value 104 to the ATE 102 as the lock time count value CNT-LOCK from the fifth column at time T4 (e.g., 390). In another example, the processor 111 compares the lock time count value CNT-LOCK with a predetermined acceptance threshold (e.g., corresponding to T5 in FIGS. 3 and 4), and sends a flag lock time parameter 104 to the ATE 102 indicating a pass if the lock time count value CNT-LOCK is less than or equal to the threshold, or a failure if CNT-LOCK is greater than the threshold.

The processor 111 in one example also computes the PLL slope at least partially according to the second count values CNT2 in the second buffer 119 (e.g., at 224 in FIG. 2). In one implementation, the processor 111 computes the slope 105 of the PLL circuit 120 according to the first count values CNT1 in the first buffer 117, and according to the second count values CNT2 in the second buffer 119. In one example, the processor 111 computes a difference value ΔCNT2 for each sampled second count value CNT2, as an absolute value of a difference between the sampled second count value CNT2 and the previous sampled second count value CNT2. The processor 111 identifies a sample corresponding to the ramp start time T2 when the difference value ΔCNT2 has a last zero value after the PLL circuit 120 was powered up at 214, and also identifies a sample corresponding to the ramp peak time T3 when the difference value ΔCNT2 reaches a peak difference count value ΔCNTMAX (e.g., 113 in FIG. 5). The processor 111 determines a reference clock ramp count value (e.g., corresponding to the ramp time value labeled At in FIGS. 3 and 5) as a difference between the sampled first count value CNT1 of the ramp start time T3 and sampled first count value CNT1 of the ramp peak time T3.

The processor 111 in this example computes the slope 105 of the PLL circuit 120 as the peak difference count value ΔCNTMAX divided by the reference clock ramp count value At. In one example, the processor 111 transmits this computed ratio as the slope value 105 to the ATE 102. In another example, the processor 111 scales the ratio according to the period of the reference clock output signal CLK1 to compute a slope value in Hz/s or other desired units and sends the scaled slope value 105 to the ATE 102. In another example, the processor 111 compares the computed slope ratio with a predetermined slope acceptance threshold, and sends a flag slope parameter 105 to the ATE 102 indicating a pass if the computed ratio is greater than the threshold, or a failure if the computed ratio is less than or equal to the threshold.

Figure 6:
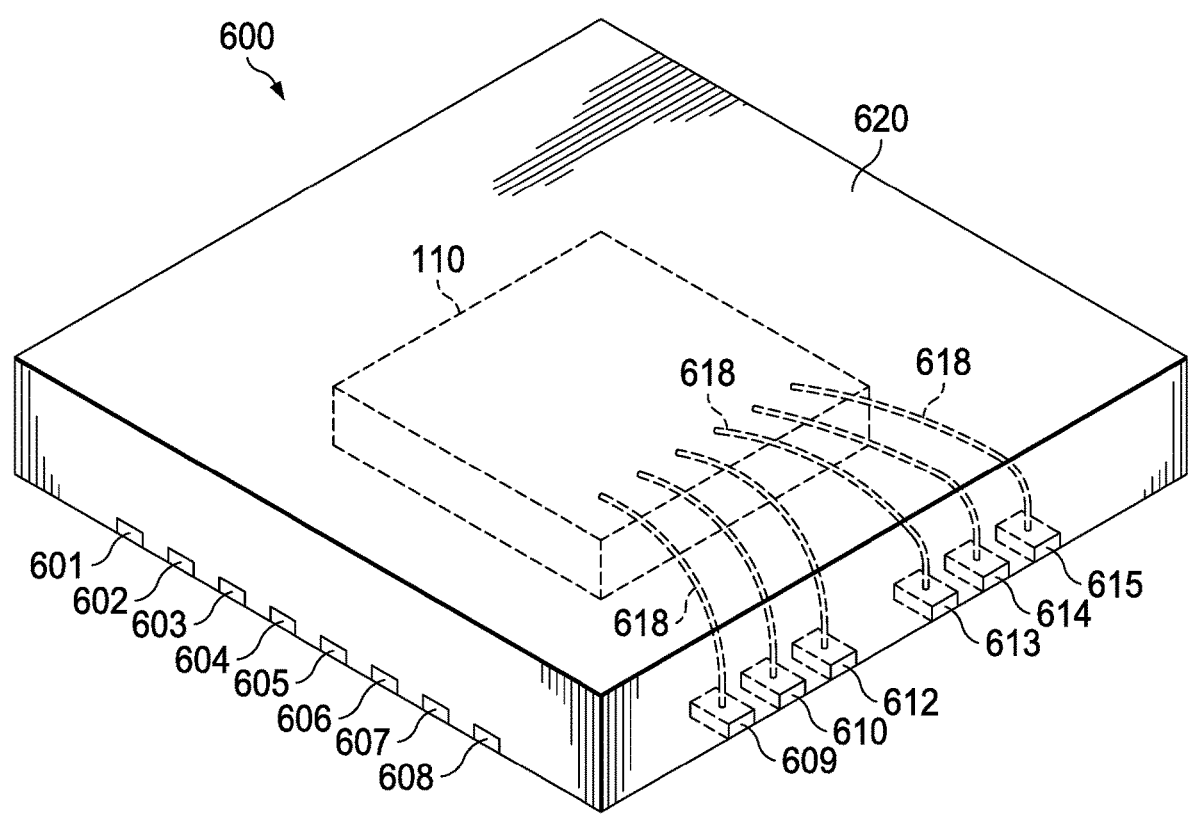
FIG. 6 is a perspective view of a packaged electronic device.

Referring also to FIG. 6, as discussed above in connection with FIG. 2, the wafer probe testing provides a pass or fail indication with respect to the PLL circuits 120 of the individual die areas 110 of the processed wafer 101. Thereafter, in one example, the wafer is singulated into individual dies and only the passing dies are packaged as integrated circuit products. FIG. 6 is a perspective view of a packaged electronic device (e.g., an IC) 600 that includes a semiconductor die 110 (e.g., formerly a die area 110 in FIG. 1 prior to wafer singulation), as well as leads 601-615, bond wires 618 and a package structure 620. As described above in connection with FIG. 1, the die 110 includes the reference clock 114 with the output 115, and the PLL circuit 120 having an input coupled to the reference clock output 115, and the CO 121 having the CO output 122.

The die 110 also includes the first counter 116 having the input coupled to the reference clock output 115, the first buffer 117 having the input coupled to the output of the first counter 116, the second counter 118 having the output, and the input coupled to the output 122 of the CO 121, and the second buffer 119 having the input coupled to the output of the second counter 118. The die 110 includes the processor 111 coupled to the output of the first buffer 117 and to the output of the second buffer 119. The package structure 620 encloses a portion of the semiconductor die 110 and portions of the leads 601-615. The leads 601-615 are electrically coupled to the semiconductor die 110 via the bond wires 618. Portions of the leads 601-615 are exposed outside the package structure 620. In one example, the first buffer 117 has a control input to control sampling of first count values CNT1 from the output of the first counter 116 at the sample rate and the second buffer 119 has a control input to control sampling of second count values CNT2 from the output of the second counter 118 at the sample rate. In one implementation, the processor 111 has an output coupled to the control inputs of the first and second buffers 117 and 119 to control the sample rate of the first and second buffers 117 and 119.

The described examples provide electronic devices and wafers with built-in self-test (BIST) apparatus for characterizing, qualifying and measuring PLL lock times and startup slopes by sampling the PLL CO frequency response in real time using dual clock counters and an associated memory buffer. In one example, before powering the PLL circuit on, the CO frequency output is connected to a counter, and the reference clock is connected to another counter. In one example, the counters decrement in response to received rising clock edges. In response to the PLL startup, the values of the counters are continually sampled at a fixed rate and stored in a memory buffer until a fixed timeout elapses, for example, to fill up the buffers, and well exceeding the design specification for CO lock time. This technique creates a digitized version of the analog frequency response in the buffer memory. The die processor 111 processes the buffer backwards from the end, determining at which point in time the delta between sampled counts starts to change, representing the CO lock point. In addition, the processor 111 computes the CO ramp slope as the maximum sampled count delta divided by the delta between the time of the maximum sample and the time of the frequency ramp start. The computed lock time and slope are then evaluated against design and test limits to determine defectiveness. The described apparatus and techniques eliminate or avoid the use of high end fast-sampling oscilloscopes for validating and testing analog PLLs and provide an efficient scalable solution suitable for wafer probe testing. In addition, the measurement is entirely internal and high-speed, compared to scope-based measurements. Certain implementations repurpose clock counters built into the die areas 110 which use the PLL output as a clock source, along with a clean reference clock source for the reference counter. The proposed test solution is fully built into the wafer design and requires no specialized external hardware for wafer probe testing of the PLL circuit 120 and facilitates an automated production test for one or more PLL performance parameters feasible where it was previously infeasible. The ability to test the PLL circuits at wafer probe helps to eliminate analog defects that would otherwise be unscreened, particularly for automotive and industrial applications requiring fast lock times with zero defects in the field. Furthermore, the real-time BIST methodology ensures the lowest possible test time and cost and eliminates errors and site-to-site variations that typically exist with external measurements in production test environments. For validation environments, accurate high-volume characterization becomes possible, reducing development cycle time.

Modifications are possible in the described examples, and other implementations are possible, within the scope of the claims.

What is claimed is:

1. A system, comprising:
   a reference clock having a reference clock output coupled to an input of a phase lock loop (PLL) circuit in a wafer;
   a first counter in the wafer, the first counter having an input coupled to the reference clock output, and an output;
   a first buffer in the wafer, the first buffer having an input coupled to the output of the first counter;
   a second counter in the wafer, the second counter having an output, and an input coupled to an output of a controlled oscillator (CO) of the PLL circuit;
   a second buffer in the wafer, the second buffer having an input coupled to the output of the second counter; and
   a processor in the wafer, the processor coupled to the output of the first buffer and to the output of the second buffer;
   wherein the processor is configured to compute a slope of the PLL circuit according to first count values in the first buffer, and second count values in the second buffer.

2. The system of claim 1, wherein the processor is configured to compute a lock time of the PLL circuit according to one of: first count values in the first buffer; and second count values in the second buffer.

3. The system of claim 2, wherein the processor is configured to compute a slope of the PLL circuit according to the first count values in the first buffer, and the second count values in the second buffer.

4. The system of claim 2, comprising a communications terminal coupled to the processor, the communications terminal adapted to be coupled to a wafer probe test system, wherein the processor is configured to receive a self-test program from the wafer probe test system, and to execute the self-test program to compute the lock time of the PLL circuit.

5. The system of claim 1, wherein:
   the first buffer is configured to sample and store first count values from the output of the first counter at a sample rate; and
   the second buffer is configured to sample and store second count values from the output of the second counter at the sample rate.

6. The system of claim 5, wherein the processor is configured to control the sample rate.

7. The system of claim 1, wherein:
   the wafer includes first and second die areas; and
   the first die area includes the first counter, the first buffer, the second counter, the second buffer, and the processor.

8. The system of claim 7, wherein the first die area includes the reference clock.

9. The system of claim 7, wherein the first die area includes the PLL circuit.

10. A method of making a packaged integrated circuit that includes a die that passed phase lock loop (PLL) performance testing, comprising:
    coupling a reference clock output of a reference clock to an input of a first counter in the die of a wafer;
    coupling the reference clock output to an input of a PLL circuit in the die;
    coupling an output of a controlled oscillator (CO) of the PLL circuit to an input of a second counter in the die;
    powering up the PLL circuit;
    sampling first count values of the first counter and second count values of the second counter at a sample rate;
    storing sampled first count values in a first buffer and sampled second count values in a second buffer;
    computing a performance parameter of the PLL circuit according to the sampled second count values in the second buffer;
    identifying whether the die passed or failed the performance parameter;
    singulating the wafer; and
    packaging the die as the packaged integrated circuit if the die passed the performance parameter.

11. The method of claim 10, comprising using a processor of the die to compute the performance parameter of the PLL circuit according to the sampled second count values in the second buffer.

12. The method of claim 11, comprising:
    engaging a wafer probe test system with a communications terminal of the die;
    using the communications terminal, loading a self-test program from the wafer probe test system to a memory of the die;
    using the processor of the die, executing the self-test program to compute the performance parameter of the PLL circuit.

13. The method of claim 10, wherein computing the performance parameter of the PLL circuit comprises computing a lock time of the PLL circuit according to the second count values in the second buffer.

14. The method of claim 13, wherein computing the lock time of the PLL circuit comprises:
    for each sampled second count value in the second buffer, computing a difference value as an absolute value of a difference between the sampled second count value and the previous sampled second count value; and
    determining a number of samples from a time when the PLL circuit was powered up to a time after which subsequent difference values change by one or less.

15. The method of claim 13, wherein computing the performance parameter of the PLL circuit comprises computing a slope of the PLL circuit according to the second count values in the second buffer.

16. The method of claim 10, wherein computing the performance parameter of the PLL circuit comprises computing a slope of the PLL circuit according to the second count values in the second buffer.

17. The method of claim 16, wherein computing the slope of the PLL circuit comprises:
    for each sampled second count value in the second buffer, computing a difference value as an absolute value of a difference between the sampled second count value and the previous sampled second count value; and
    determining a ramp time value as a number of samples from a ramp start time when the difference value has a last zero value after the PLL circuit was powered up to a ramp peak time when the difference value reaches a peak difference count value;
    determining a reference clock ramp count value as a difference between the sampled first count value of the ramp start time and sampled first count value of the ramp peak time; and
    computing the slope of the PLL circuit as the peak difference count value divided by the reference clock ramp count value.

18. An electronic device, comprising:
    a semiconductor die having:
       a reference clock having a reference clock output,
       a phase lock loop (PLL) circuit having an input coupled to the reference clock output, and a controlled oscillator (CO) having an output,
       a first counter having an input coupled to the reference clock output, and an output,
       a first buffer having an input coupled to the output of the first counter, a second counter having an output, and an input coupled to the output of the CO, a second buffer having an input coupled to the output of the second counter, and a processor coupled to the output of the first buffer and to the output of the second buffer;

a package structure that encloses a portion of the semiconductor die; and leads electrically coupled to the semiconductor die, the leads being at least partially exposed outside the package structure;

wherein the first buffer has a control input to control sampling of first count values from the output of the first counter at a sample rate; the second buffer has a control input to control sampling of second count values from the output of the second counter at the sample rate; and the processor has an output coupled to the control inputs of the first and second buffers to control a sample rate of the first and second buffers.

* * * * *